(12) United States Patent
Huang

(10) Patent No.: US 12,206,060 B2
(45) Date of Patent: Jan. 21, 2025

(54) LEAD FRAME ASSEMBLY AND CHIP PACKAGING DEVICE

(71) Applicant: CHANG WAH TECHNOLOGY CO., LTD., Kaohsiung (TW)

(72) Inventor: Chia-Neng Huang, Kaohsiung (TW)

(73) Assignee: CHANG WAH TECHNOLOGY CO., LTD., Kaohsiung (TW)

( * ) Notice: Subject to any disclaimer, the term of this patent is extended or adjusted under 35 U.S.C. 154(b) by 466 days.

(21) Appl. No.: 17/828,567

(22) Filed: May 31, 2022

(65) Prior Publication Data

US 2023/0155091 A1 May 18, 2023

(30) Foreign Application Priority Data

Nov. 18, 2021 (TW) .................................. 110213701

(51) Int. Cl.
*H01L 33/62* (2010.01)
*H01L 33/48* (2010.01)
*H01L 33/60* (2010.01)
*H01L 33/38* (2010.01)
*H01L 33/54* (2010.01)

(52) U.S. Cl.
CPC ............ *H01L 33/62* (2013.01); *H01L 33/486* (2013.01); *H01L 33/60* (2013.01); *H01L 33/38* (2013.01); *H01L 33/54* (2013.01)

(58) Field of Classification Search
CPC ....... H01L 33/62; H01L 33/486; H01L 33/60; H01L 33/38; H01L 33/54
See application file for complete search history.

(56) References Cited

U.S. PATENT DOCUMENTS

2004/0232527 A1* 11/2004 Ito .......................... H01L 24/97
257/E21.504
2013/0221507 A1* 8/2013 Niu ....................... H01L 21/565
257/676

* cited by examiner

*Primary Examiner* — Samuel A Gebremariam
(74) *Attorney, Agent, or Firm* — MUNCY, GEISSLER, OLDS & LOWE P.C

(57) ABSTRACT

Disclosed herein is a lead frame assembly including a frame and lead frame units each including a chip holder having first and second electrode pads; and a pin unit having a first pin, a second pin and third pins each extending from the chip holder. The pin unit extending from one of the lead frame units is connected to the pin unit of the adjacent one of the lead frame units. For the lead frame units disposed adjacent to the frame, the pin units extending towards the frame are connected to the frame such that the lead frame units are fixedly positioned within the frame. A chip packaging device including a lead frame body and a packaging structure is also disclosed.

10 Claims, 6 Drawing Sheets

LEAD FRAME ASSEMBLY AND CHIP PACKAGING DEVICE

CROSS-REFERENCE TO RELATED APPLICATION

This application claims priority of Taiwanese Utility Model Patent Application No. 110213701, filed on Nov. 18, 2021.

FIELD

The present disclosure relates to a lead frame assembly for accommodating a light-emitting diode and a chip packaging device.

BACKGROUND

In the manufacturing of a chip packaging device, a light-emitting diode is usually disposed on a lead frame, and then an encapsulant is applied to cover the light-emitting diode and the lead frame. The lead frame generally includes a chip holder which is made of an electrically conductive material and which supports the light-emitting diode thereon, and a reflector cup which is made from thermosetting resin and which is disposed on the chip holder. To be specific, the reflector cup has properties such as high temperature resistance, ultraviolet radiation resistance, among others, and is used to enhance light extraction efficiency of the light-emitting diode. The chip holder includes two electrode carriers for accommodating the light-emitting diode disposed thereon, and a plurality of pins. The pins are connected to the electrode carriers and are embedded in the reflector cup, and each of the pins is exposed outwardly from a peripheral surface of the reflector cup.

However, the greater the number of the pins exposed outwardly, the easier it is for moisture to enter into the chip packaging device through interfaces formed between the pins and the reflector cup, causing the light-emitting diode to be damaged due to contact with moisture, and thus, a great number of pins would adversely affect the reliability of the chip packaging device.

SUMMARY

Therefore, an object of the present disclosure is to provide a lead frame assembly and a chip packaging device which can alleviate at least one of the drawbacks of the prior art.

According to one aspect of the present disclosure, a lead frame assembly includes a frame and plurality of lead frame units arranged in an array and made of an electrically conductive material. The array of the lead frame units includes a plurality of rows each extending along a first direction and a plurality of columns each extending along a second direction. The lead frame units are connected to one another within the frame and each includes a chip holder and a pin unit. The chip holder has a first electrode pad and a second electrode pad which are electrically independent of each other and which are spaced apart from each other along the first direction. The pin unit has at least one first pin extending along the first direction from a side edge of the first electrode pad distal from the second electrode pad, at least one second pin extending along the first direction from a side edge of the second electrode pad distal from the first electrode pad, and a plurality of third pins extending along a second direction from a side edge of the first electrode pad and a side edge of the second electrode pad. An arrangement of the first and second electrode pads in each of the lead frame units is opposite to that of the first and second electrode pads in an adjacent one of the lead frame units along the second direction. The first electrode pads or the second electrode pads of the chip holders of two adjacent ones of the lead frame units in each of the rows are adjacent to each other along the first direction. The first electrode pad and the second electrode pad in each of the lead frame units respectively have pin-free side edges opposite to the side edges formed with the third pins. The pin unit extending from one of the lead frame units is connected to the pin unit of the adjacent one of the lead frame units. For the lead frame units disposed adjacent to the frame, the pin units extending towards the frame are connected to the frame such that the lead frame units are fixedly positioned within the frame.

According to another aspect of the present disclosure, a chip packaging device includes a lead frame body and a packaging structure. The lead frame body includes a chip holder and a pin unit. The chip holder has a first electrode pad and a second electrode pad which are electrically independent of each other and which are spaced apart from each other along a first direction. The first electrode pad has a top surface and a bottom surface opposite to the top surface. The second electrode pad has a top surface and a bottom surface opposite to the top surface. The pin unit has at least one first pin extending from a side edge of the first electrode pad distal from the second electrode pad to be away from the first electrode pad, at least one second pin extending from a side edge of the second electrode pad distal from the first electrode pad to be away from the second electrode pad, and a plurality of third pins extending from a side edge of the first electrode pad and a side edge of the second electrode pad to be away from the first and second electrode pads. The packaging structure has a filling body which fills gaps among the first electrode pad, the second electrode pad and the pin unit, and a reflector cup formed on a surface of the chip holder to expose the top surfaces of the first and second electrode pads, respectively, so as to define a packaging space. The filling body has three connecting peripheral surfaces through which the first pin, the second pin and the third pins are exposed therefrom.

BRIEF DESCRIPTION OF THE DRAWINGS

Other features and advantages of the present disclosure will become apparent in the following detailed description of the embodiments with reference to the accompanying drawings, of which.

DETAILED DESCRIPTION

Figure 1:
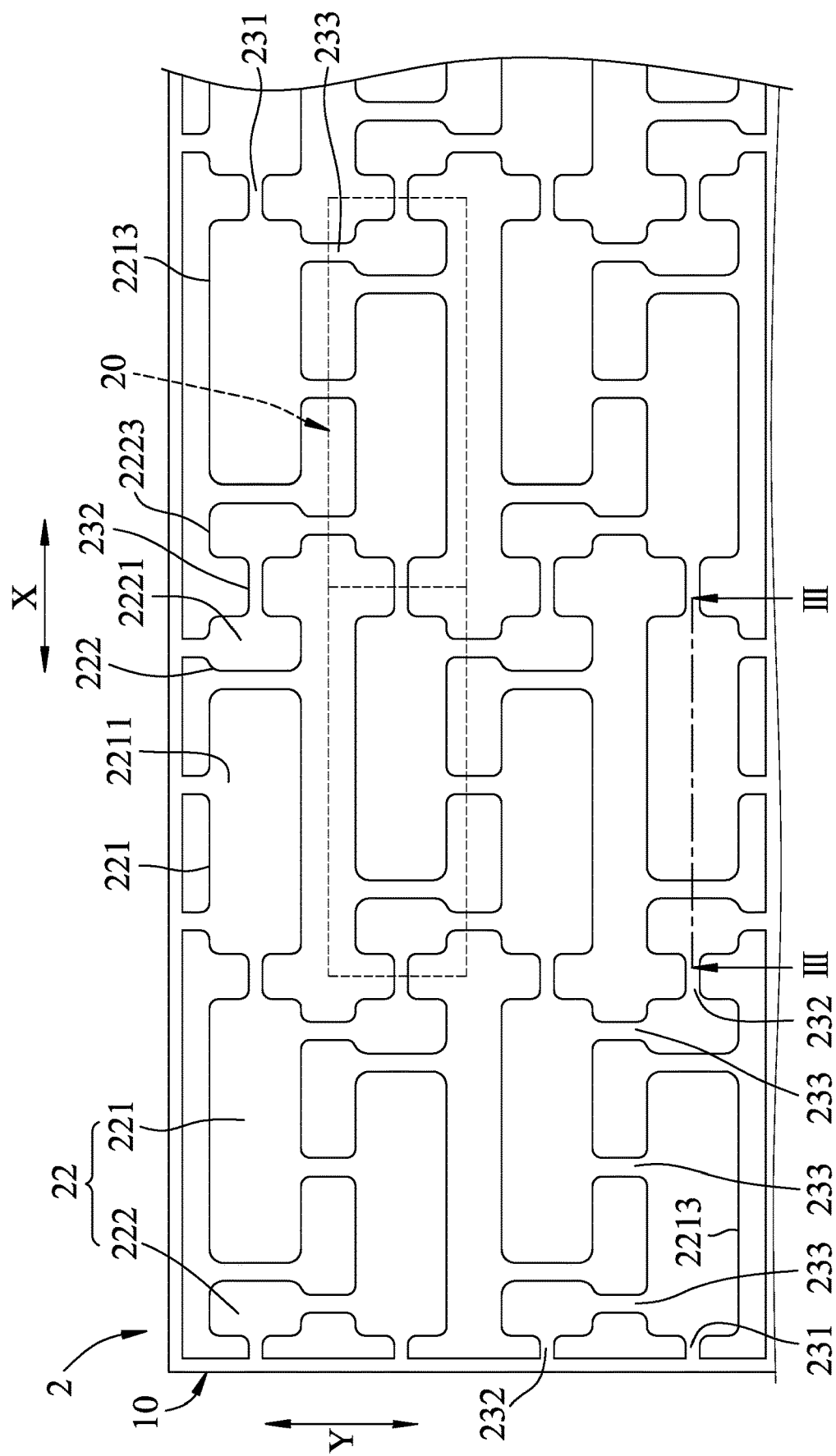
FIG. 1 is a fragmentary schematic view illustrating an embodiment of a lead frame assembly of the present disclosure.

Before the present invention is described in greater detail, it should be noted that where considered appropriate, reference numerals or terminal portions of reference numerals have been repeated among the figures to indicate corresponding or analogous elements, which may optionally have similar characteristics.

Figure 3:
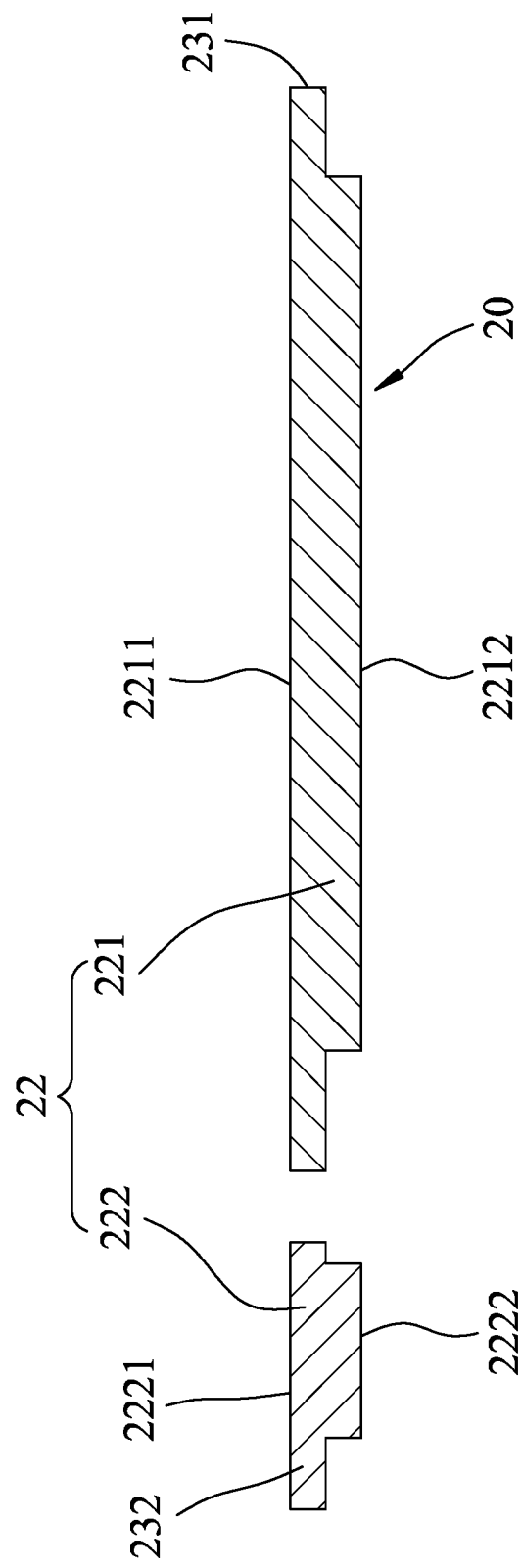
FIG. 3 is a schematic cross-sectional view taken along line III-III of FIG. 1.

Referring to FIGS. 1 and 3, an embodiment of a lead frame assembly of the present disclosure includes a frame 10 and plurality of lead frame units 2 arranged in an array and made of an electrically conductive material. The array of the lead frame units 2 includes a plurality of rows each extending along a first direction (X) and a plurality of columns each extending along a second direction (Y). The lead frame units 2 are connected to each other within the frame 10, and each includes a chip holder 22, and a pin unit 23.

In this embodiment, the frame 10 is a square-shaped frame 10. In certain embodiments, the frame 10 may be formed to have other shapes, such as circle, rectangle, polygon, etc.

The chip holder 22 has a first electrode pad 221 and a second electrode pad 222 which are electrically independent of each other, and which are spaced apart from each other by a gap along the first direction (X). The first electrode pad 221 has a top surface 2211 and a bottom surface 2212 opposite to the top surface 2211. The bottom electrode pad 222 has a top surface 2221 and a bottom surface 2222 opposite to the top surface 2221. In this embodiment, in each of the lead frame units 2, a surface area of the first electrode pad 221 is larger than that of the second electrode pad 222. In each of the first and second electrode pads 221, 222, the bottom surface 2212, 2222 has an area smaller than that of the top surface 2211, 2221, so that a distance between the top surfaces 2211, 2221 are smaller than a distance between the bottom surfaces 2212, 2222. However, in certain embodiments, according to practical requirements, in each of the lead frame units 2, the surface area of the first electrode pad 221 and that of the second electrode pad 222 may be the same with or different from each other.

In addition, an arrangement of the first and second electrode pads 221, 222 in each of the lead frame units 2 is opposite to that of the first and second electrode pads 221, 222 in an adjacent one of the lead frame units 2 along the second direction (Y).

The chip holders 22 of two adjacent ones of the lead frame units 2 in each row along the first direction (X) are mirror-symmetrical to each other, such that the same type of the electrode pads (i.e., the first electrode pad 221 or the second electrode pad 222) of the chip holders 22 of the two adjacent ones of the lead frame units 2 are adjacent to each other along the first direction (X).

The pin unit 23 has a first pin 231 extending along the first direction (X) from a side edge of the first electrode pad 221 distal from the second electrode pad 222, a second pin 232 extending along the first direction (X) from a side edge of the second electrode pad 222 distal from the first electrode pad 221, and a plurality of third pins 233 extending along the second direction (Y) from a side edge of the first electrode pad 221 and a side edge of the second electrode pad 222.

It should be noted that, the first electrode pad 221 and the second electrode pad 222 in each of the lead frame units respectively have pin-free side edges 2213, 2223 opposite to the side edges formed with the third pins 233.

In this embodiment, the first electrode pads 221 and the second electrode pads 222 of the chip holders 22 of the adjacent two of the lead frame units 2 in each of the columns are connected to each other through the third pins 233 extending along the second direction (Y). The first electrode pads 221 and the second electrode pads 222 of the chip holders 22 of the adjacent two of the lead frame units 2 in each of the columns do not connect with each other at the pin-free side edges 2213, 2223.

As exemplified in this embodiment, two of the third pins 233 extend outwardly along the second direction (Y) from the side edge of the first electrode pad 221, and one of the third pins 233 extends outwardly along the second direction (Y) from the side edge of the second electrode 222.

In each of the lead frame units 2, the first, second and third pins 231, 232, 233 extend outwardly from the top surfaces 2211, 2221 of the first and second electrode pads 221, 222. The pin unit 23 extending from one of the lead frame units 2 is connected to the pin unit 23 of the adjacent one of the lead frame units 2.

In this embodiment, for the lead frame units 2 disposed adjacent to the frame 10, the pin units 23 extending towards the frame 10 are connected to the frame 10 such that the lead frame units 2 are fixedly positioned within the frame 2. To be specific, portions of the first pins 231, second pins 232, and third pins 233 extending from the first and second electrode pads 221, 222 towards the frame 10 are connected to the frame 10.

It should be noted that, in certain embodiments, the number, shape, and arrangement of the first, second and third pins 231, 232, 233 may be varied according to practical requirements, and are not limited to those of the aforesaid embodiment.

Figure 2:
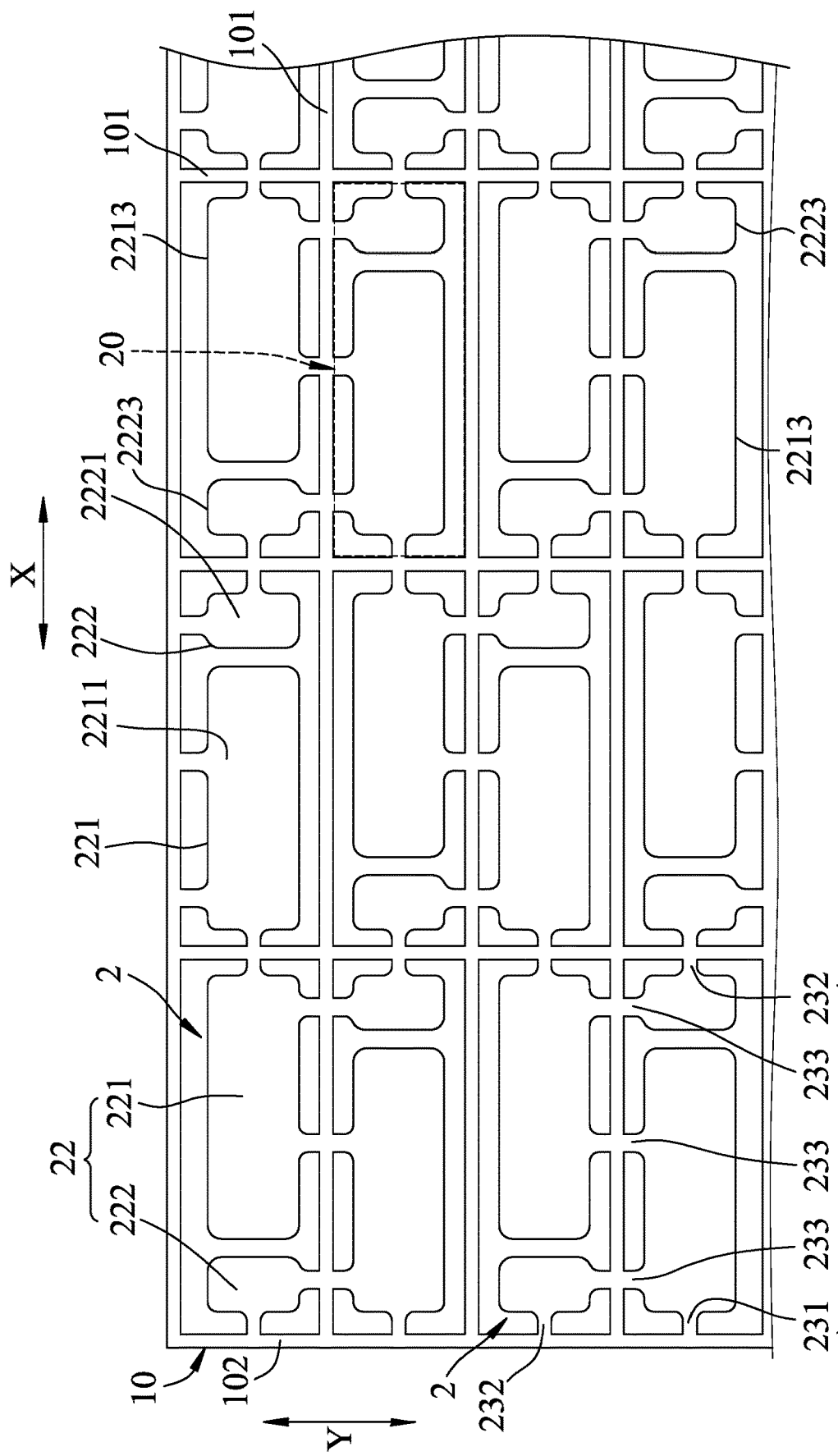
FIG. 2 is a fragmentary schematic view illustrating a variation of the embodiment of the lead frame assembly.

Referring to FIG. 2, in a variation of the embodiment, the frame 10 includes an outer frame portion 102 and a plurality of supporting frames portions 101 that are interconnected to form a grid shape and that are located within the outer frame portion. The supporting frames portions 101 separate the lead frame units 2. The first, second and third pins 231, 232, 233 extending from the first and second electrodes 221, 222 of each of the lead frame unit 2 towards the outer frame portion 102 and/or the supporting frame portions 101 are connected to the outer frame portion 102 and/or the supporting frame portions 101.

Figure 4:
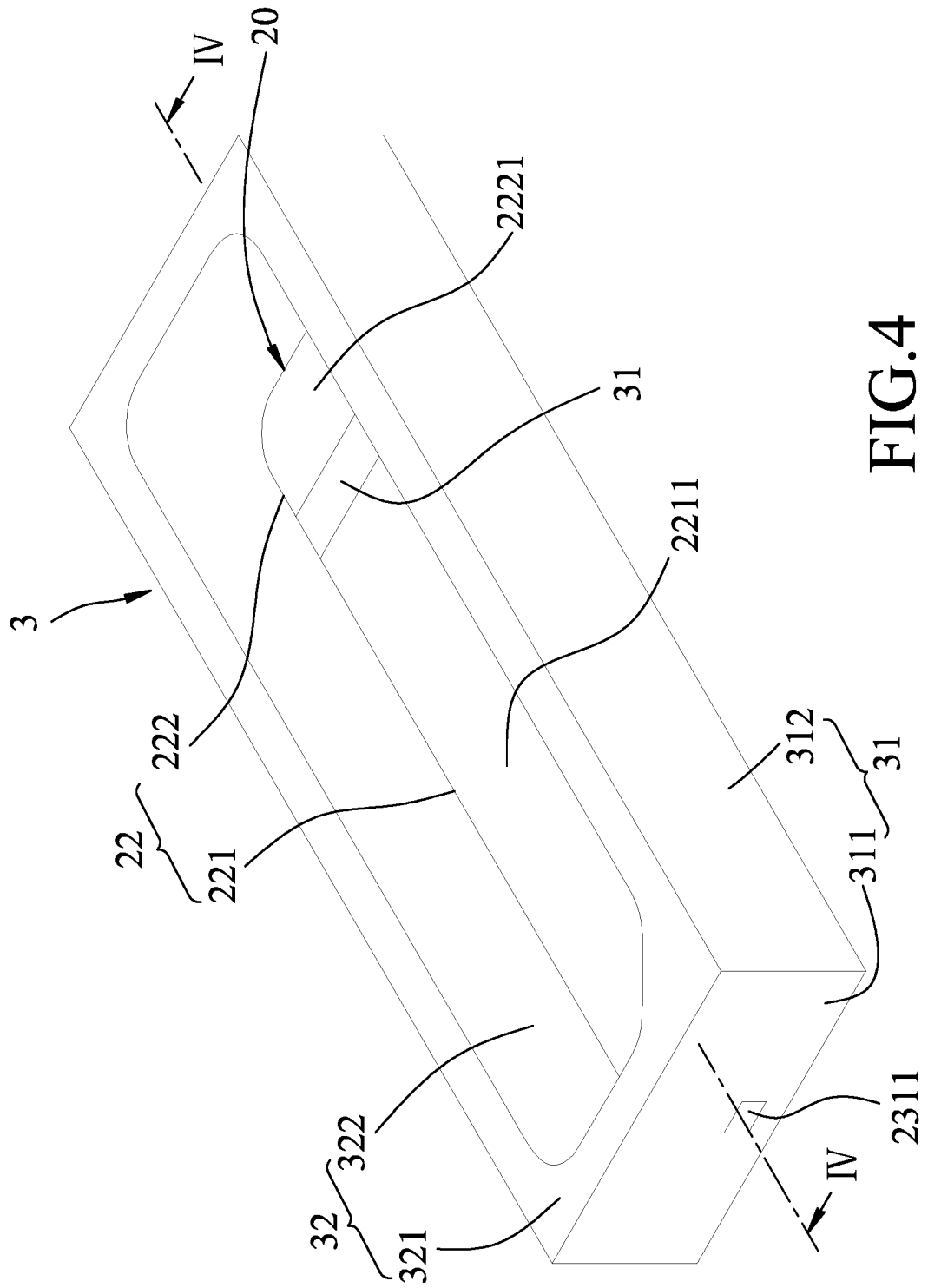
FIG. 4 is a perspective view illustrating an embodiment of a chip packaging device of the present disclosure.
Figure 5:
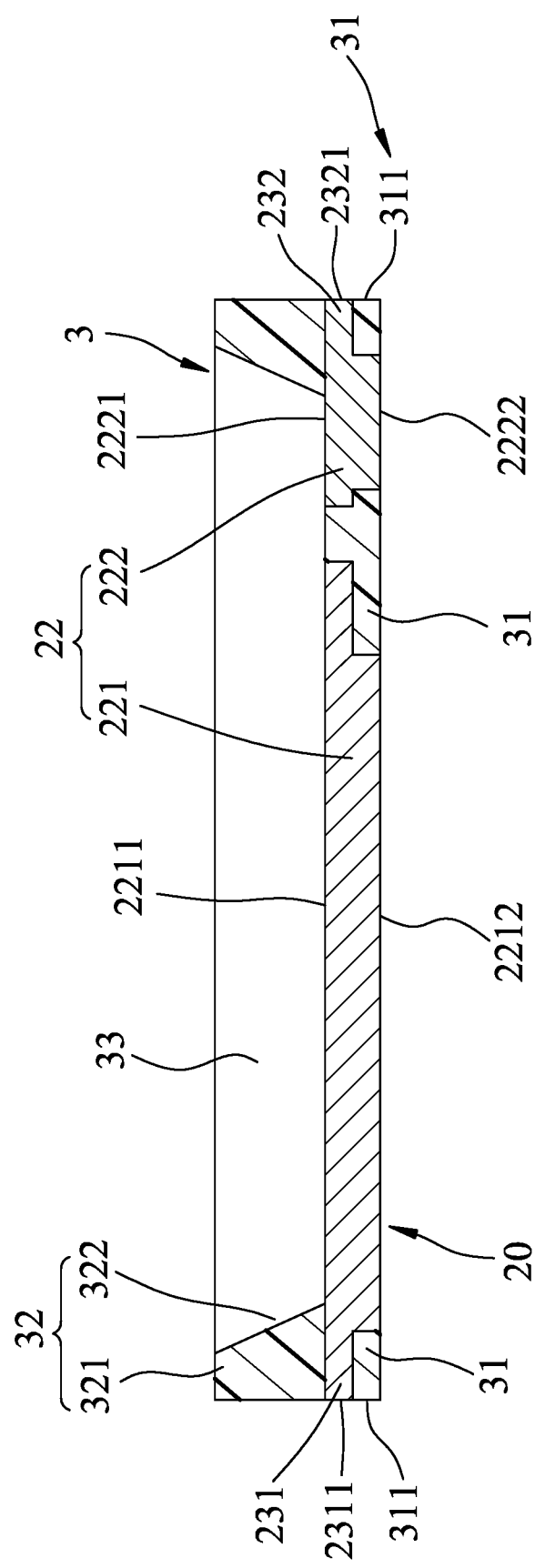
FIG. 5 is a schematic cross-sectional view taken along line IV-IV of FIG. 4.

Referring to FIGS. 4 and 5, an embodiment of a chip packaging device of the present disclosure is prepared from the aforesaid lead frame assembly, and includes a lead frame body 20 and a packaging structure 3.

The lead frame body 20 includes the chip holder 22 and the pin unit 23 as shown in FIGS. 1 to 3. The first pin 231 extends from the side edge of the first electrode pad 221 distal from the second electrode pad 222 to be away from the first electrode pad 221, the second pin 232 extends from the side edge of the second electrode pad 222 distal from the first electrode pad 221 to be away from the second electrode pad 222, and a plurality of third pins 233 extending from a side edge of the first electrode pad 221 and a side edge of the second electrode pad 222 to be away from the first and second electrode pads 221, 222.

The packaging structure 3 is made of a resin material, and has a filling body 31 and a reflector cup 32.

The filling body 31 fills gaps among the first electrode pad 221, the second electrode pad 222, and the pin unit 23, and covers the side edges of the chip holder 22. The filling body 31 has three connecting peripheral surfaces 311 through which the first pin 231, the second pin 232 and the third pins 233 are exposed therefrom, and a non-connecting peripheral surface 312 that is not in contact with the pin unit 23. To be specific, the first pin 231 has an end point 2311 exposed from a first one of the connecting peripheral surfaces 311, the second pin 232 has an end point 2321 exposed from a second one of the connecting peripheral surfaces 311, and each of the third pins 233 has an end point (not shown) exposed from a third one of the connecting peripheral surfaces 311.

The connecting peripheral surfaces 311 and the non-connecting peripheral surface 312 are connected to each other.

The reflector cup 32 is formed on a surface of the chip holder 22 to expose the top surfaces 2211, 2221 of the first and second electrode pads 221, 222, respectively, so as to define a packaging space 33. The reflector cup 32 may cover the first, second and third pins 231, 232, 233, and a part of the filling body 31 which defines the connecting peripheral surfaces 311 and the non-connecting peripheral surface 312. The reflector cup 32 has an upper surface 321 away from the chip holder 22, and an inner peripheral surface 322 connected to the upper surface 321 and extending towards the chip holder 22. An angle between the inner peripheral surface 322 and each of the top surfaces 2211, 2221 of the first and second electrode pads 221, 222 is 90 degrees or greater than 90 degrees, so that the reflector cup 32 can reflect a portion of light emitted by a chip unit 4 (to be described later) disposed in the packaging space 33 to change a direction of light path towards an opening of the packaging space 33, thereby improving light extraction efficiency.

Figure 6:
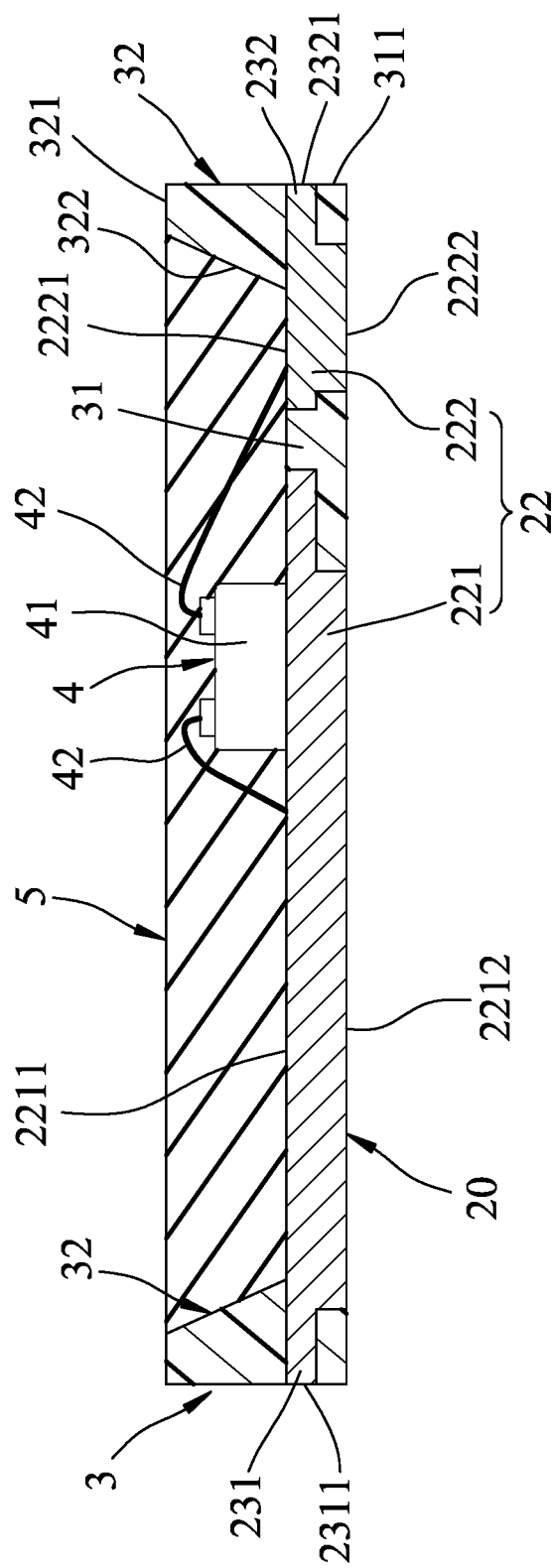
FIG. 6 is a schematic cross-sectional view illustrating a chip unit and an encapsulant of the chip packaging device of the present disclosure.

Referring to FIG. 6, the chip packaging device of the present disclosure may further include a chip unit 4 and an encapsulant 5. The chip unit 4 has a chip 41 disposed on the first electrode pad 221, and a plurality of wires 42 electrically connecting the chip 41 to the first and second electrode pads 221, 222. The encapsulant 5 is made of an insulating material that is light-transmissive, and fills the packaging space 33 to cover the chip unit 4 so as to provide protection. It should be noted that, the chip 41 may also be disposed on the second electrode pad 222 according to practical requirements.

A method for manufacturing the chip packaging device of the present disclosure is briefly described hereinafter. First, gaps in each of the lead frame units 2 of the lead frame assembly are filled with a filling material so as to form the filling body 31 in each of the lead frame units 2, and then the reflector cup 32 is formed on the chip holder 22 so as to form the packaging structure 3. In certain embodiments, the packaging structure 3 is formed by a molding process. Thereafter, a chip unit 4 is disposed on the chip holder 22, and then an encapsulant 5 is filled into the packaging space 33 to cover the chip unit 4, followed by a dicing process performed on each of the lead frame units 2 to remove the frame 21 therefrom, thereby obtaining a plurality of chip packaging devices that are separated from one another.

Since the pin unit 23 of the lead frame body 20 only extends outwardly from the chip holder 22 through the three connecting peripheral surfaces 311, and since no pin is exposed from the non-connecting peripheral surface 312, penetration of moisture through the interfaces between the pin unit 23 and the filling body 31 into an interior part of the chip packaging device of the present disclosure can be reduced, thereby improving the yield and service life of the chip packaging device.

In summary, with the chip holder 22 having pin-free side edges 2213, 2223, and other side edges with the first, second and third pins 231, 232, 233 extending therefrom, after subjecting the lead frame assembly to the molding, packaging and dicing processes, the non-connecting peripheral surface 312 of the filling body 31 is not in contact with the pin unit 23. Therefore, penetration of moisture through the interfaces between the pin unit 23 and the filling body 31 into the chip packaging device can be reduced.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A lead frame assembly, comprising:
    a frame; and
    a plurality of lead frame units arranged in an array and made of an electrically conductive material, said array of said lead frame units includes a plurality of rows each extending along a first direction and a plurality of columns each extending along a second direction,
    said lead frame units being connected to one another within said frame and each including
        a chip holder having a first electrode pad and a second electrode pad which are electrically independent of each other and which are spaced apart from each other along the first direction, and
        a pin unit having
            at least one first pin extending along the first direction from a side edge of said first electrode pad distal from said second electrode pad,
            at least one second pin extending along the first direction from a side edge of said second electrode pad distal from said first electrode pad, and
            a plurality of third pins extending along a second direction perpendicular to the first direction from a side edge of said first electrode pad and a side edge of said second electrode pad;
    wherein
    an arrangement of said first and second electrode pads in each of said lead frame units is opposite to that of said first and second electrode pads in an adjacent one of said lead frame units along the second direction,
    said first electrode pads or said second electrode pads of said chip holders of two adjacent ones of said lead frame units in each of the rows are adjacent to each other along the first direction,
    said first electrode pad and said second electrode pad in each of said lead frame units respectively have pin-free side edges opposite to said side edges formed with said third pins,
    said pin unit extending from one of said lead frame units is connected to said pin unit of said adjacent one of said lead frame units, and
    for said lead frame units disposed adjacent to said frame, said pin units extending towards said frame are connected to said frame such that said lead frame units are fixedly positioned within said frame.

2. The lead frame assembly as claimed in claim 1, wherein said first electrode pads and said second electrode pads of said chip holders of said adjacent two of said lead frame units in each of the columns do not connect with each other at said pin-free side edges.

3. The lead frame assembly as claimed in claim 1, wherein said first electrode pads and said second electrode pads of said chip holders of said adjacent two of said lead frame units in each of the columns are connected to each other through said third pins extending along the second direction.

4. The lead frame assembly as claimed in claim 1, wherein, in each of said lead frame units, said first electrode pad has a top surface and a bottom surface opposite to said top surface, said second electrode pad having a top surface and a bottom surface opposite to said top surface, said bottom surfaces having an area smaller than that of said top surfaces, respectively, a distance between said top surfaces being smaller than that between said bottom surfaces.

5. The lead frame assembly as claimed in claim 4, wherein, in each of said lead frame units, said first, second and third pins extend outwardly from said top surfaces of said first and second electrode pads.

6. The lead frame assembly as claimed in claim 1, wherein, in each of said lead frame units, surface area of said first electrode pad and that of said second electrode pad are the same with or different from each other.

7. The lead frame assembly as claimed in claim 1, wherein said chip holders of two adjacent ones of said lead frame units in each of the rows along the first direction being mirror-symmetrical to each other.

8. A chip packaging device, comprising:
a lead frame body including
a chip holder having a first electrode pad and a second electrode pad which are electrically independent of each other and which are spaced apart from each other along a first direction, said first electrode pad having a top surface and a bottom surface opposite to said top surface, said second electrode pad having a top surface and a bottom surface opposite to said top surface, and
a pin unit having at least one first pin extending from a side edge of said first electrode pad distal from said second electrode pad to be away from said first electrode pad, at least one second pin extending from a side edge of said second electrode pad distal from said first electrode pad to be away from said second electrode pad, and a plurality of third pins extending from a side edge of said first electrode pad and a side edge of said second electrode pad to be away from said first and second electrode pads; and
a packaging structure having a filling body which fills gaps among said first electrode pad, said second electrode pad and said pin unit, and a reflector cup formed on a surface of said chip holder to expose said top surfaces of said first and second electrode pads, respectively, so as to define a packaging space,
wherein said filling body has three connecting peripheral surfaces through which said first pin, said second pin and said third pins are exposed therefrom.

9. The chip packaging device as claimed in claim 8, wherein said filling body further has a non-connecting peripheral surface that is not in contact with said pin unit, said connecting peripheral surfaces and said non-connecting peripheral surface being connected to each other.

10. The chip packaging device as claimed in claim 8, further comprising
a chip unit having a chip disposed on one of said first electrode pad and said second electrode pad, and a plurality of wires electrically connecting said chip to said first and second electrode pads; and
an encapsulant filling said packaging space and covering said chip unit.

\* \* \* \* \*